Figure 1:
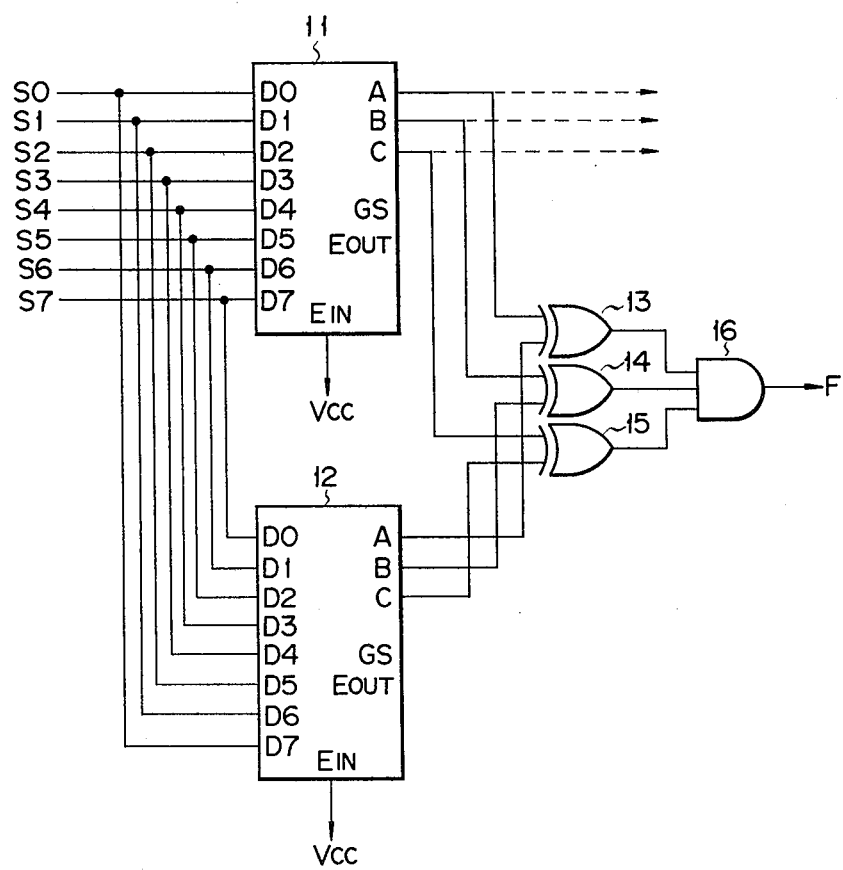

United States Patent [19]

Tanaka et al.

[11] 4,426,699

[45] Jan. 17, 1984

[54] APPARATUS FOR DETECTING SINGLE EVENT

[75] Inventors: Eiichi Tanaka, Mitaka; Norimasa Nohara; Takehiro Tomitani, both of Chiba; Mineki Nishikawa, Otawara, all of Japan

[73] Assignees: The Director of the National Institute of Radiological Sciences, Science and Technology Agency; Tokyo Shibaura Denki Kabushiki Kaisha, both of Japan

[21] Appl. No.: 125,572

[22] Filed: Feb. 28, 1980

[30] Foreign Application Priority Data

Mar. 2, 1979 [JP] Japan .................................. 54-24152

[51] Int. Cl.$^3$ ...................... G06F 11/30; H03K 13/32; H03K 19/21
[52] U.S. Cl. ...................................... 371/68; 307/440; 307/471; 328/154; 371/52; 371/57
[58] Field of Search .............. 307/471, 440, 445, 442; 328/109, 117, 119, 152, 154; 340/146.2; 371/52, 57, 68

[56] References Cited

U.S. PATENT DOCUMENTS

| 2,848,532 | 8/1958 | Weida | 371/57 X |
|---|---|---|---|
| 3,321,743 | 5/1967 | Nador | 340/146.2 |
| 3,387,263 | 6/1968 | Dosse | 340/146.2 |
| 3,541,507 | 11/1970 | Duke | 371/52 X |
| 3,886,520 | 5/1975 | Christensen | 371/52 |
| 3,979,720 | 9/1976 | Laas | 328/117 |
| 4,020,460 | 4/1977 | Jones et al. | 371/57 |
| 4,087,786 | 5/1978 | Lescinsky et al. | 371/52 |

OTHER PUBLICATIONS

Boudeile, "One Out of N Detector", *IBM Tech. Discl. Bull.*, vol. 13, No. 6, pp. 1490-1491, 11/70.

*Primary Examiner*—Larry N. Anagnos
*Attorney, Agent, or Firm*—Finnegan, Henderson, Farabow, Garrett & Dunner

[57] ABSTRACT

A plurality of input signals are applied to input terminals of first and second priority encoders according to the order of priority in ascending and descending orders, respectively. The encoded output signals of the first and second priority encoders are exclusive-ORed for each corresponding pair of significant bits. A single event detection is executed only if exclusive OR is effected for all the corresponding pairs of significant bits.

4 Claims, 2 Drawing Figures

APPARATUS FOR DETECTING SINGLE EVENT

This invention relates to an apparatus for detecting a single event.

Radiotherapeutic diagnosing apparatus include scintillation cameras. Recently, scintillation cameras utilizing positrons have been developed, namely, positron cameras. These positron cameras provide scintigrams with higher measurement accuracy both in position and in quantity than that of conventional scintillation cameras, measuring annihilation radiation which is caused when positrons emitted from radioisotope named positron emitter are combined with electrons. With one such positron camera, coincidence counting is used in identifying the occurrence position of the annihilation radiation by determining the annihilation radiation. In the coincidence counting, two detectors are disposed facing each other with a patient dosed with positron emitter between them. The occurrence of an annihilation radiation at any point on a straight line connecting the two detectors is identified when such annihilation radiation is detected simultaneously by both these detectors. A plurality of annihilation radiations may occur during the coincidence counting, though this is a rare event. In this case, the two detectors cannot make correct measurements of the annihilation radiation occurrence positions. In such cases, therefore, detection signals corresponding to the plurality of annihilation radiations are not individually detected at measurement but rather only a single annihilation radiation at a time is detected to determine the correct annihilation radiation occurrence position. To attain this, the fact that a single annihilation is produced is ascertained for each detector by single event detection, and a detection signal is processed as an objective data for position determination only when both detectors simultaneously detect the annihilation radiation.

The aforementioned single event detection is based on the following expression.

$$F = \left( \sum_{i=0}^{n-1} S_i \right) \cdot \prod_{n-1 \geq i > j \geq 0} (\overline{S_i \cdot S_j}) \quad (1)$$

Here F is a logical function, n is the number of binary logic signals, $S_i$ represents the binary result obtained from ORing of $S_0, S_1, \ldots S_{n-1}$, and $$\prod_{n-1 \geq i > j \geq 0} (\overline{S_i \cdot S_j})$$

is expressed as follows:

$$(\overline{S_0 \cdot S_1}) \cdot (\overline{S_0 \cdot S_2}) \ldots (\overline{S_0 \cdot S_{n-1}}),$$

$$(\overline{S_0 \cdot S_1}) \cdot (\overline{S_1 \cdot S_2}) \ldots (\overline{S_1 \cdot S_{n-1}}),$$

$$\ldots$$

$$\ldots$$

$$\ldots (\overline{S_{n-2} \cdot S_{n-1}}).$$

In equation (1), if $n=2$ is given, the result is:

$$F = (S_0 + S_1) \cdot (\overline{S_0 \cdot S_1}) \quad (2)$$

$$= S_0 \cdot \overline{S_1} + \overline{S_0} \cdot S_1$$

Equation (2) is a logical expression of exclusive OR of two inputs, which may be processed by using a single exclusive OR gate, e.g. Model CD-4030 IC from RCA. If the value of n is increased, however, a logical circuit must be comprised of a large number of logical elements including inverters, AND gates, OR gates, etc. Thus, the larger the n value, the more complicated the configuration of the logic circuit will be.

Accordingly, the object of this invention is to provide a single event detecting apparatus of simple configuration capable of processing a large number of binary logic signals for single event detection.

According to a single event detecting apparatus of this invention, first and second $2^m$-bit priority encoders satisfying a condition $2^{m-1} < n \leq 2^m$ are prepared, and n binary logic input signals are applied to the first $2^m$-bit priority encoder according to prioroty orders i ($i=0$ to $2^m-1$) and applied to the second priority encoder according to priority orders $2^m-1-i$. There is provided a gate circuit which compares the encoded signals from the first and second priority encoders for each corresponding pair of significant bits, and produces an output signal only when the contents of every corresponding pair of significant bits differ from each other.

Figure 2:
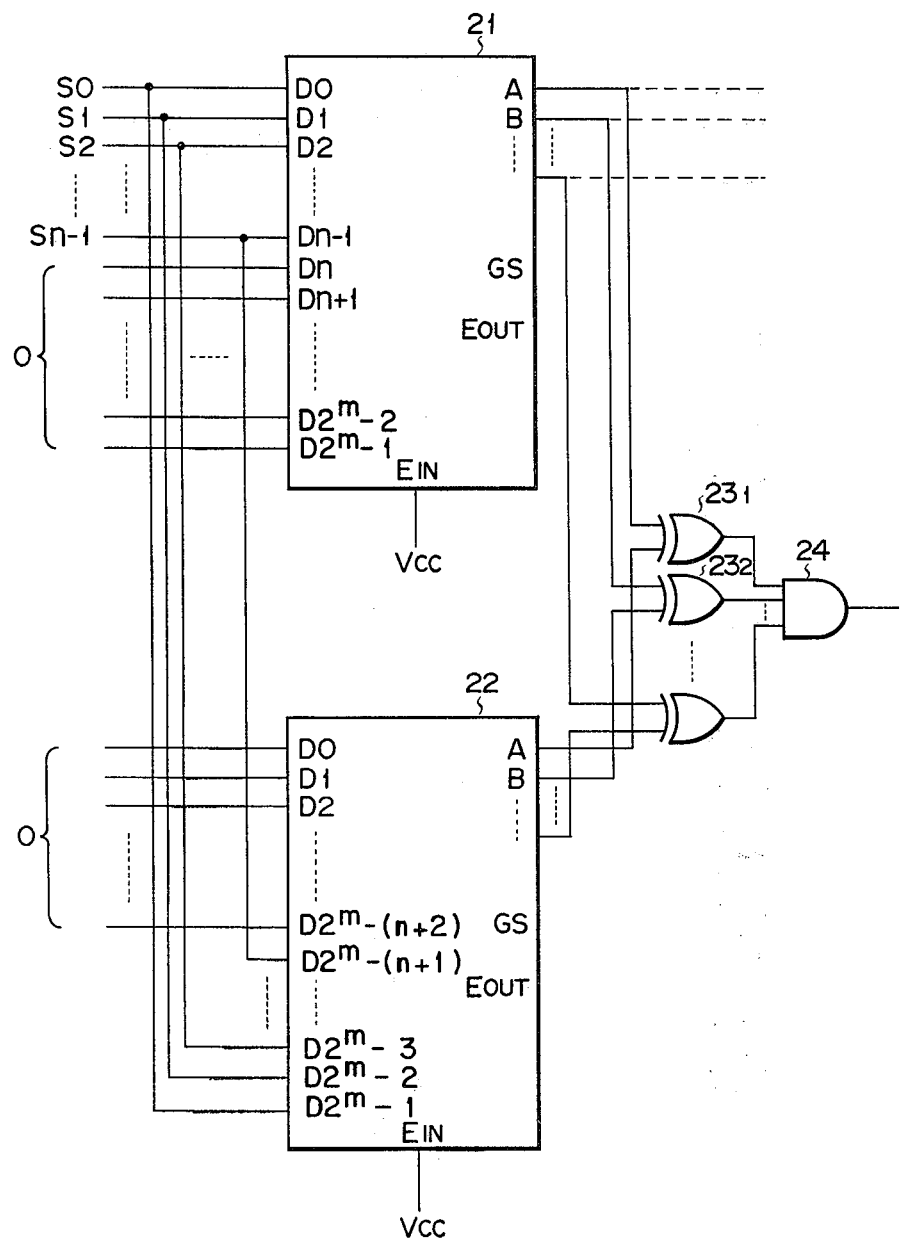

This invention can be more fully understood from the following detailed description when taken in conjunction with the accompanying drawings, in which:

FIG. 1 is a circuit diagram of a logic circuit to process 8 binary input signals according to an embodiment of this invention; and FIG. 2 is a circuit diagram of a logic circuit to process n binary input signals.

FIG. 1 shows a logic circuit in which the n value of equation (1), i.e. the number of binary input signals, is 8. As shown in this drawing, 8 binary input signals $S_0$, $S_1$, $S_2$, $S_3$, $S_4$, $S_5$, $S_6$ and $S_7$ are led respectively to input terminals $D_0$, $D_1$, $D_2$, $D_3$, $D_4$, $D_5$, $D_6$ and $D_7$ of an integrated circuit device, for example, an 8-bit priority encoder 11, as well as to input terminals $D_7$, $D_6$, $D_5$, $D_4$, $D_3$, $D_2$, $D_1$ and $D_0$ of an IC device, for example, an 8-bit priority encoder 12, by means of their corresponding lines. For the priority encoders, Model CD-4532 encoders from RCA Corp. or Model SN-74148 encoders from Texas Instruments, Inc., for example, may be used. Output terminals A, B and C of the priority encoder 11 are connected to first input terminals of exclusive OR gates 13, 14 and 15, while input terminals A, B and C of the priority encoder 12 are connected to second input terminals of the exclusive OR gates 13, 14 and 15, respectively. The output terminals of the exclusive OR gates 13, 14 and 15 are connected to input terminals of an AND gate 16 severally.

Referring to FIG. 1, the operation of the logic circuit which uses, for example, Model CD-4532 priority encoders for the priority encoders 11 and 12 will be described. The priority encoders 11 and 12 are so constructed that 8 input terminals $D_0$, $D_1$, $D_2$, $D_3$, $D_4$, $D_5$, $D_6$ and $D_7$ have priority orders in an ascending order. That is, the input terminals $D_0$ and $D_7$ have Least Significant Bit (LSB) and Most Significant Bit (MSB), respectively. In such priority encoders 11 and 12, when the logic level of an enable input $E_{IN}$ becomes "1", that is, when the level of the input $E_{IN}$ exceeds the threshold logic level, one with the highest priority among the input terminals whose logic level is "1" is identified, and the input to the identified input terminal is encoded into a binary code and taken out from the output terminals A, B and C. The following is a function table obtained where $E_{IN}$="1" is given.

TABLE

| $D_7$ | $D_6$ | $D_5$ | $D_4$ | $D_3$ | $D_2$ | $D_1$ | $D_0$ | C | B | A |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 0 | 0 | 0 | 1 | 0 | 0 | 0 |
| 0 | 0 | 0 | 0 | 0 | 0 | 1 | * | 0 | 0 | 1 |
| 0 | 0 | 0 | 0 | 0 | 1 | * | * | 0 | 1 | 0 |
| 0 | 0 | 0 | 0 | 1 | * | * | * | 0 | 1 | 1 |
| 0 | 0 | 0 | 1 | * | * | * | * | 1 | 0 | 0 |
| 0 | 0 | 1 | * | * | * | * | * | 1 | 0 | 1 |
| 0 | 1 | * | * | * | * | * | * | 1 | 1 | 0 |
| 1 | * | * | * | * | * | * | * | 1 | 1 | 1 |

In the above table, * may represent either 0 or 1. The outputs of the output terminals A, B and C of the encoders 11 and 12 represent least, middle and most significant bits respectively. If the outputs of the output terminals A, B and C of the encoder 11 are $A_1$, $B_1$ and $C_1$ respectively, and if the outputs of the output terminals A, B and C of the encoder 12 are $A_2$, $B_2$ and $C_2$ respectively, then the outputs $A_1$ and $A_2$ are supplied to the exclusive OR gate 13, the outputs $B_1$ and $B_2$ are supplied to the exclusive OR gate 14, and the outputs $C_1$ and $C_2$ are supplied to the exclusive OR gate 15. The outputs of these exclusive OR gates 11, 12 and 13 are supplied to the AND gate 16, which produces a signal corresponding to the aforesaid logical function F. More specifically, if all the signals $S_0$ to $S_7$ are "0", then the outputs $A_1$, $B_1$, $C_1$, $A_2$, $B_2$ and $C_2$ of the output terminals A, B and C are all "0", as shown in the function table. Accordingly, the outputs of the exclusive OR gates are all "0", so that the output of the AND gate 16 is "0".

Meanwhile, if the level of one of the input signals $S_0$ to $S_7$, e.g. the input signal $S_0$, turns to "1", the inputs to the input terminal $D_0$ of the encoder 11 and the input terminal $D_7$ of the encoder 12 to which the signal $S_0$ is applied are encoded into binary codes. As a result, the outputs $A_1$, $B_1$ and $C_1$ of the output terminals A, B and C of the encoder 11 remain "0", while the outputs $A_2$, $B_2$ and $C_2$ of the output terminals A, B and C of the encoder 12 turn to "1". Thus, all the outputs of the exclusive OR gates 13, 14 and 15 turn to "1", so that the output of the AND gate 16, i.e., F, becomes "1".

Further, if the levels of two or more of the input signals $S_0$ to $S_7$, e.g., the input signals $S_1$ and $S_5$, turn to "1", the input to the input terminal $D_5$ with higher priority as between the input terminals $D_1$ and $D_5$ of the encoder 11 to which the input signals $S_1$ and $S_5$ are supplied respectively is encoded into a binary code. According to the function table, the outputs $A_1$, $B_1$ and $C_1$ of the outut terminals A, B and C of the encoder 11 represents 1, 0 and 1 respectively, while the outputs $A_2$, $B_2$ and $C_2$ of the encoder 12 represent 0, 1 and 1 respectively. Consequently, the output of the exclusive OR gate 15 becomes "0" and the outputs of the exclusive OR gates 13 and 14 become "1", so that the output of the AND gate 16 becomes "0".

Now let it be supposed that the level of the three input terminals $S_3$, $S_4$ and $S_5$ become "1". Then, the inputs to the highest-priority input terminal $D_5$ of the encoder 11 and the highest-priority input terminal $D_4$ of the encoder 12 are encoded into binary codes. Accordingly, the outputs $A_1$, $B_1$ and $C_1$ represent 1, 0 and 1 respectively, while the outputs $A_2$, $B_2$ and $C_2$ represent 0, 0 and 1 respectively. In consequence, the output of the AND gate 16 becomes "0".

If all the input signals $S_0$ to $S_7$ are "0", then the outputs $A_1$, $B_1$ and $C_1$ of the encoder 11, as well as the outputs $A_2$, $B_2$ and $C_2$, are all "0". Thus, the outputs of the exclusive OR gates 13, 14 and 15 are all "0", so that the output of the AND gate 16 is "0".

If one of the input signals $S_0$ to $S_7$ whose logic level is brought to "1", as described above, is Si (i=0, 1, 2, ... or 7), i is converted into a binary code by the encoder 11, and (7-i) is converted into another binary code by the encoder 12. Exclusive OR is effected bit by bit between i and (7-i) in a binary form, so that the output of the AND gate 16 becomes "1". If the levels of two or more of the input signals $S_0$ to $S_7$ turn to "1", i is converted into a binary code by the encoder 11, and (7-j) is converted into another binary code by the encoder 12. Here i represents an input signal corresponding to the highest priority, while j represents one corresponding to the lower priority. Since i≠j is given, exclusive OR cannot be effected between at least one pair of the outputs $A_1$ and $A_2$, $B_1$ and $B_2$, and $C_1$ and $C_2$ of the encoders 11 and 12, so that output of the AND gate 16 is "0". Thus, single event detection can be executed by identifying the logic level ("1" or "0") of the output of the AND gate 16.

A case will be described in which n (an integer) is given as the number of inputs instead of 8. In this case, $2^m$-bit priority encoders are used for the priority encoders. Here m is defined as follows:

$$2^{m-1} < n \leq 2^m.$$

If n is 10, for example, the result is as follows:

$$2^{4-1} < 10 \leq 2^4.$$

In other words, given n=10, it follows that m is 4.

Two $2^m$-bit priority encoders are connected as shown in FIG. 2. More specifically, the line of the input signal $S_0$ is connected to an input terminal $D_0$ of a first priority encoder 21, and the line for the input signal $S_1$ is connected to an input terminal $D_1$ of the same encoder. Thus, lines for input signals $S_0$ to $S_{n-1}$ are connected to input terminals $D_0$ to $D_{n-1}$ of the encoder 21, respectively. Logic "0" is applied to remaining input terminals $D_n$, $D_{n+1}$, ... $D_{2m}-1$. Regarding a second priority encoder 22, lines for input signals $S_0$, $S_1$, $S_2$, ... $S_{n-1}$ are connected to input terminals $D_{2m}-1$, $D_{2m}-2$, ... $D_{2m}-(n+1)$ respectively, and logic "0" is applied to remaining input terminals $D_{2m}-(n+2)$, ... $D_2$, $D_1$ and $D_0$.

When supplied to the priority encoders 21 and 22, the input signals $S_0$ to $S_n$ are converted into binary codes by the encoders 21 and 22. Binary code signals delivered from output terminals A, B, ... of the priority encoders 21 and 22 are exclusive-ORed by means of exclusive OR gates $23_1$, $23_2$, ..., and then ANDed by means of an AND gate 24. The output of the AND gate 24 corresponds to the aforementioned logical function F.

According to the logic circuit obtaining the logical function F by using the $2^m$-bit priority encoders, as described above, a great number of logical elements are not required, so that a large number of inputs can be processed by using very simple circuit arrangements.

Thus, with the above-mentioned logic circuit, encoded signals representing some of input signals $S_0$ to $S_{n-1}$ whose logic level are "1" may be obtained from priority encoders upon single detection, so that they may be used as address signals for a memory, if extracted as indicated by broken lines in FIGS. 1 and 2.

According to this invention, as described hereinbefore, single event detection by means of binary logic signals may be achieved by the use of simple circuit arrangements, without regard to the number of the binary logic signals.

What we claim is:

1. A logic circuit comprising a first priority encoder satisfying a condition $2^{m-1} < n \leq 2^m$ for n binary logic input signals and having a plurality of input terminals to which said n binary logic input signals are applied according to input priority orders i ($i = 0$ to $2^m - 1$) respectively, whereby an input signal corresponding to the highest priority is converted into a binary code signal constituted by a plurality of significant bits; a second priority encoder satisfying the same condition of said first priority encoder and having a plurality of input terminals to which said binary logic input signals are applied according to priority orders $2^m 1 - i$ respectively, whereby an input signal corresponding to the highest priority is converted into a binary code signal constituted by a plurality of significant bits; and a gate circuit section for bitwise comparison of the binary code signals from said first and second priority encoders and for producing an output signal only when the contents of every corresponding pair of significant bits differ from each other thereby detecting a single event of the n binary logic signals on the input lines.

2. A logic circuit according to claim 1, characterized in that said gate circuit section is composed of gate circuit (13, 14, 15) to carry out exclusive OR operation of the corresponding significant bits of said binary code signals, and a gate circuit (16) to carry out AND operation of the exclusive OR outputs of all the corresponding significant bits.

3. A logic circuit according to claim 1 or 2, characterized in that if said binary logic input signals ($S_0$ to $S_{n-1}$) are fewer than the input terminals of each of said first and second priority encoders (21 and 22), the same logic signals (0) are applied to remaining input terminals.

4. An apparatus for detecting input lines, comprising:
n number of input lines supplied with binary logic signals;
a pair of priority encoders, one of which has a plurality of input terminals connected to the n number of input lines in a first order of priority and the other of which has a plurality of input terminals connected to said n number of input lines in a reverse order to the first order of priority, for encoding the binary logic signal on an input line having a logic signal nearest to one of least significant bit and most significant bit into n bit signals where $2^{m-1} < n \leq 2^m$, thereby respectively producing two sets of m bit signals; and
an exclusive logic circuit for outputting an exclusive ORed signal of said two sets m bit signals, thereby detecting input lines having logic signals thereon.

* * * * *